(12) United States Patent
Wang et al.

(10) Patent No.: US 8,748,936 B2
(45) Date of Patent: Jun. 10, 2014

(54) METHODS AND STRUCTURES FOR ELECTROSTATIC DISCHARGE PROTECTION

(75) Inventors: Shih-Yu Wang, Taipei (TW); Chia-Ling Lu, Luzhou (TW); Yan-Yu Chen, Taipei (TW); Yu-Lien Liu, Hsinchu (TW); Tao-Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/555,075

(22) Filed: Jul. 20, 2012

(65) Prior Publication Data

US 2012/0286322 A1 Nov. 15, 2012

Related U.S. Application Data

(63) Continuation of application No. 12/410,335, filed on Mar. 24, 2009, now Pat. No. 8,253,165, which is a continuation-in-part of application No. 12/264,879, filed on Nov. 4, 2008, now abandoned.

(51) Int. Cl.
*H01L 29/73* (2006.01)

(52) U.S. Cl.
USPC ........... 257/133; 257/173; 257/175; 257/355; 257/E29.181; 438/135; 438/340; 438/336

(58) Field of Classification Search
USPC .......... 257/133, 173, 175, 355, 356, E29.181; 438/135, 340, 336
See application file for complete search history.

(56) References Cited

U.S. PATENT DOCUMENTS

| 7,042,028 | B1 * | 5/2006 | Huang et al. | 257/173 |
| 7,728,349 | B2 * | 6/2010 | Boselli | 257/111 |
| 2002/0089017 | A1 * | 7/2002 | Lai et al. | 257/355 |
| 2007/0052032 | A1 * | 3/2007 | Huang et al. | 257/357 |

* cited by examiner

*Primary Examiner* — Thinh T Nguyen
(74) *Attorney, Agent, or Firm* — Kilpatrick Townsend & Stockton LLP

(57) ABSTRACT

A semiconductor device includes a first well region of a first conductivity type, a second well region of a second conductive type within the first well region. A first region of the first conductivity type and a second region of the second conductivity type are disposed within the second well region. A third region of the first conductivity type and a fourth region of the second conductivity type are disposed within the first well region, wherein the third region and the fourth region are separated by the second well region. The semiconductor device also includes a switch device coupled to the third region.

23 Claims, 18 Drawing Sheets

METHODS AND STRUCTURES FOR ELECTROSTATIC DISCHARGE PROTECTION

CROSS-REFERENCE TO RELATED APPLICATIONS

This application is a continuation application of U.S. patent application Ser. No. 12/410,335, filed Mar. 24, 2009, which is a continuation-in-part of U.S. patent application Ser. No. 12/264,879, filed Nov. 4, 2008, both of which are commonly assigned and incorporated in their entirety by reference for all purposes.

BACKGROUND OF THE INVENTION

Semiconductor devices in an integrated circuit are susceptible to damages caused by electro-static discharge (ESD). ESD can be induced by the motion of static electricity generated from a non-conductive surface. For example, a human body moving on a carpet may gather thousands of volts of static electricity. Moreover, in integrated circuits testing or packaging environment, even higher static electricity may be generated. The high energy pulses of the electro-static discharge (ESD) can cause severe damage to the devices in the integrated circuits.

To prevent the damage of the integrated circuits due to the electro-static discharge, an ESD protection circuit is often included in the integrated circuit. Conventionally, in an MOS or CMOS integrated circuit, the ESD protection circuit often includes parasitic bipolar junction transistor (ex. NPN) or a silicon control rectifier (SCR) which is turned on by the high voltage pulses in an ESD event. For example, in a lateral double-diffused MOSFET (LDMOS), a conventional ESD protection structure includes a p-type contact region near a drain region of the LDMOS device. As a result, a parasitic SCR is formed by the p-type contact, the n-well, the p-substrate, the source region. Such an SCR is turned on, or triggered, to provide a current discharge path, if a high voltage at the drain contact pad is high enough to cause an avalanche breakdown at the junction between the n-well and p-substrate.

Even though conventional ESD protection structures are useful in some applications, many limitations still exist. For example, conventional ESD protection structures often have high trigger voltages. In certain applications, such high trigger voltages do not provide adequate ESD protection to the integrated circuit. These and other limitations are described throughout the present specification and more particularly below.

From the above, it is seen that an improved technique for ESD protection in semiconductor devices is desired.

BRIEF SUMMARY OF THE INVENTION

The present invention is directed to integrated circuits. More particularly, the invention provides a device for integrated circuits having electrostatic discharge (ESD) protection structure for providing an ESD current path having a lower trigger voltage than a conventional silicon controlled rectifier (SCR). Merely by way of example, the invention has been applied LDMOS lateral double-diffused MOSFET (LDMOS), high voltage filed transistors, and low voltage MOSFET for improved ESD protection. But it would be recognized that the invention has a much broader range of applicability.

According to a specific embodiment, the invention provides a semiconductor device which includes a first well region of a first conductivity the first well region includes a first well contact region of the first conductivity type for coupling to a first potential. The device includes a source region of the second conductivity type within the first well region and coupled to the first potential. A second well region of the second conductivity type is disposed adjacent to the first well region. The second well region includes a first portion and a second portion. The device also includes a drain region of the second conductivity type. At least a portion of the drain region is disposed within the first portion of the second well region. Additionally, the device includes a third doped region of the first conductivity type in the first portion of the second well region. The third doped region is adjacent to the drain region and electrically coupled to the drain region. The device also includes a fourth doped region of the second conductivity type within the second portion of the second well region. The fourth doped region is adjacent to the source region. The device further includes a switch device coupled to the fourth doped region. In the semiconductor device also includes a first transistor coupled to the switch device through the fourth doped region. The first transistor includes the third doped region, the second well region, and the first well region. A second transistor includes the second well region, the first well region, and the source region. The first and the second transistors are configured to provide a current path during an ESD event. According to embodiments of the invention, the current path is triggered at a lower trigger voltage than a conventional SCR ESD protection device.

In a specific embodiment of the device, the first conductivity type is p-type, and the second conductivity type is n-type. In an embodiment, the first potential is a ground potential. The switch device can be a diode. A first terminal of the diode is coupled to the fourth doped region and a second terminal of the diode is coupled to a power supply potential. In another embodiment, the switch device includes a MOSFET. A first terminal of the MOSFET is coupled to the fourth doped region, and a second terminal of the MOSFET is coupled to the first potential. A gate terminal of the MOSFET is electrically coupled to the drain region through a capacitor and electrically coupled to the first potential through a resistor.

In another embodiment of the semiconductor device, the semiconductor device includes a lateral double diffused MOSFET (LDMOS), which includes a channel region in the first well region, a gate dielectric overlying the channel region, a field oxide region between the channel region and the drain region, and a gate electrode overlying the gate dielectric and the field oxide region. In another embodiment the semiconductor device includes a high voltage field transistor, which has a field oxide region between the source region and the drain region. In yet another embodiment, the semiconductor device includes a low voltage MOSFET, which further includes a channel region in the first well region between the source region and the drain region and a gate dielectric overlying the channel region, and a gate electrode overlying the gate dielectric. At least a portion of the drain region is within the first well region.

According to an alternative embodiment, a semiconductor device includes a p-type well region, which has a first well contact for coupling to a ground potential. The device includes an n-type source region within the p-type well region. The source region is coupled to the ground potential. The device includes an n-type well region adjacent to the p-type well region. The n-type well region includes a first portion and a second portion. The device also includes an n-type drain region. At least a portion of the drain region is within the first portion of the n-type well region. The p-type doped region is adjacent to the drain region and electrically coupled to the drain region. The device also includes an n-type doped region within the second portion of the n-type well region. The n-type doped region is adjacent to the source region. The device further includes a switch device coupled to the n-type doped region. Additionally, the device includes two transistors. The first transistor includes the p-type doped region, the n-type well region, and the p-type well region. The first transistor is coupled to the switch device through the n-type doped region. The second transistor includes the n-type drain region, the p-type well region, and the n-type source region. When an ESD event occurs, a current path is provided to forward bias the base-emitter junction of first transistor and turn on the first transistor. The base-emitter junction of the second transistor is forwarded biased due to turn-on current of first device, and the second transistor is also turned on. Thus, the first and the second transistors provide a current path during an ESD event.

In a specific embodiment the switch device includes a diode. A first terminal of the diode is coupled to the fourth doped region, and a second terminal of the diode is coupled to a power supply potential. In another embodiment, the switch device includes a MOSFET. A first terminal of the MOSFET is coupled to the fourth doped region, and a second terminal of the MOSFET is coupled to the first potential. In an embodiment, a gate terminal of the MOSFET is electrically coupled to the drain region through a capacitor and electrically coupled to the first potential through a resistor.

According to another alternative embodiment, a semiconductor device includes a first well region of a first conductivity type, a second well region of a second conductive type within the first well region. A first region of the first conductivity type and a second region of the second conductivity type are disposed within the second well region. A third region of the first conductivity type and a fourth region of the second conductivity type are disposed within the first well region, wherein the third region and the fourth region are separated by the second well region. The semiconductor device also includes a switch device coupled to the third region.

Many benefits are achieved by way of the present invention over conventional techniques. For example, in an embodiment, the invention provides ESD protection structures having lower trigger voltages for improved ESD protection. In specific embodiments, the improved ESD protection structures include a switch device coupled to an ESD current path. In various embodiments, the invention provides improved ESD protection structures for various devices, such as LDMOS, high voltage field transistor, and low voltage MOSFET. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a device for integrated circuits having electrostatic discharge (ESD) protection structure for providing an ESD current path which has a lower trigger voltage than a convention npn bipolar and silicon controlled rectifier (SCR). Merely by way of example, the invention has been applied to LDMOS lateral double-diffused MOSFET (LDMOS), high voltage field transistors, and low voltage MOSFET for improved ESD protection. But it would be recognized that the invention has a much broader range of applicability.

As discussed above, conventional ESD protection device structures based on SCR often have high trigger voltages. In a conventional ESD protection structure, the SCR and npn are often turned on, or triggered, if a high voltage at the drain contact pad is high enough to cause an avalanche breakdown at the junction between the n-well and p-substrate. This tends to result in a high trigger voltage, for example, 40-50V or higher. The conventional ESD protection structures also suffer from other limitations. Accordingly, an improved technique for ESD protection structures in semiconductor devices is highly desired.

Depending upon the embodiment, the present invention includes various features, which may be used. These features include the following:

1. ESD protection structures for providing a lower trigger voltage for improved ESD protection;
2. Improved ESD protection structures including a switch device coupled to an ESD current path; and
3. Improved ESD protection structures for various devices, such as LDMOS, high voltage field transistor, and low voltage MOSFET.

As shown, the above features may be in one or more of the embodiments to follow. These features are merely examples, which should not unduly limit the scope of the claims herein. One of ordinary skill in the art would recognize many variations, modifications, and alternatives.

Figure 1:
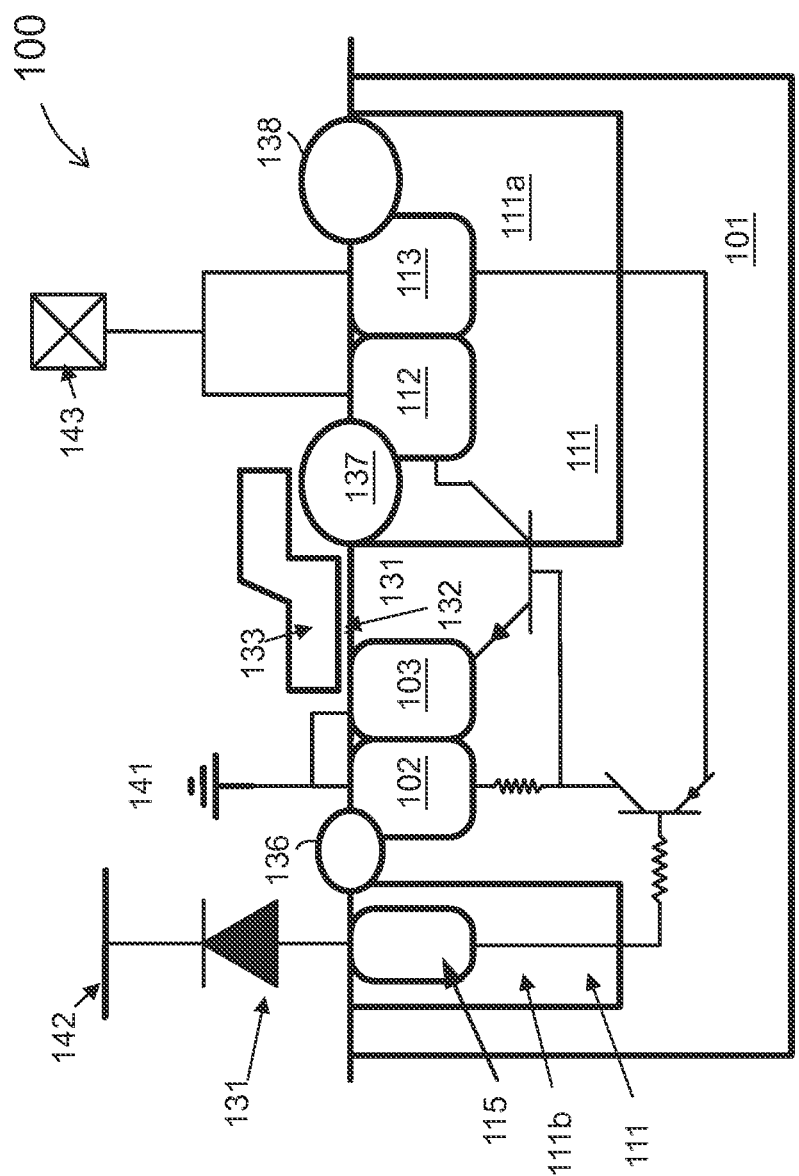
FIG. 1 is a simplified cross-sectional view diagram of a lateral double diffused MOSFET (LDMOS) device according to an embodiment of the present invention.

FIG. 1 is a simplified cross-sectional view diagram of a lateral double diffused MOSFET (LDMOS) device according to an embodiment of the present invention. This diagram is merely an example, which should not unduly limit the scope of the claims herein. One of ordinary skill in the art would recognize other variations, modifications, and alternatives. As shown, LDMOS device 100 is a semiconductor device, e.g., a silicon device, which includes a p-type well region 101. The p-type well region 101 includes a first well contact 102 for coupling to a ground potential 141. Device 100 also includes an n-type source region 103 within the p-type well region 101, and the source region 103 is also coupled to the ground potential 141. Device 100 includes an n-type well region 111 adjacent to the p-type well region 101.

In the cross-sectional view of FIG. 1, n-type well region 111 is shown as two separate regions. In some embodiments, the n-type well region can include multiple regions which are contiguous. In FIG. 1, the first portion 111a is the n-well region on the right-hand side of the figure, and the second portion 111b is the n-well region on the left-hand side of the figure. In a specific embodiment, the first portion and the second portion are contiguous regions. Device 100 also includes an n-type drain region 112, and at least a portion of the drain region is within the n-type well region 111. In FIG. 1, the n-type drain region 112 is located within the first portion of the n-type well region 111a, but in other embodiments, part of the n-type drain region can be extended outside the n-type well region.

In FIG. 1, a p-type doped region 113 is disposed in the n-type well region 111. As shown, the p-type doped region 113 is adjacent to the drain region 112 and electrically coupled to the drain region 112. In some embodiments, the p-type dope region 113 may be positioned next to drain region 112, but in other embodiments, there can be a suitable distance between the p-type doped region 113 and the drain region 112 according to device or layout requirements. As shown in FIG. 1, the n-type drain region 112 and the p-type doped region 113 are electrically connected to a pad 143. Device 100 also includes an n-type doped region 115 within a portion of the n-type well region 111 which is close to the source region 103. Device 100 also includes a diode device 131 which electrically couples the n-type doped region 115 to a power supply potential 142 (VDD).

As shown in FIG. 1, the LDMOS 100 also includes a channel region 131 in the p-type well region 101 and a gate dielectric 132 overlying the channel region. The LDMOS 100 also includes field oxide regions 136, 137, and 138. A gate electrode 133 overlies the gate dielectric 132 and field oxide region 133. As shown, field oxide region 137 is disposed between the channel region 131 and the drain region 112.

In FIG. 1, the p-type doped region 113, the first portion of the n-type well region 111a close to the drain region 112, and n-type well region 111 form a PNP transistor. Similarly, the n-type well region 111, the p-type well region 101 and the second portion of the n-type well region 111b close to the source region 103 form an NPN transistor. Further details of the LDMOS device are discussed below with reference to FIGS. 2 and 3.

Figure 2:
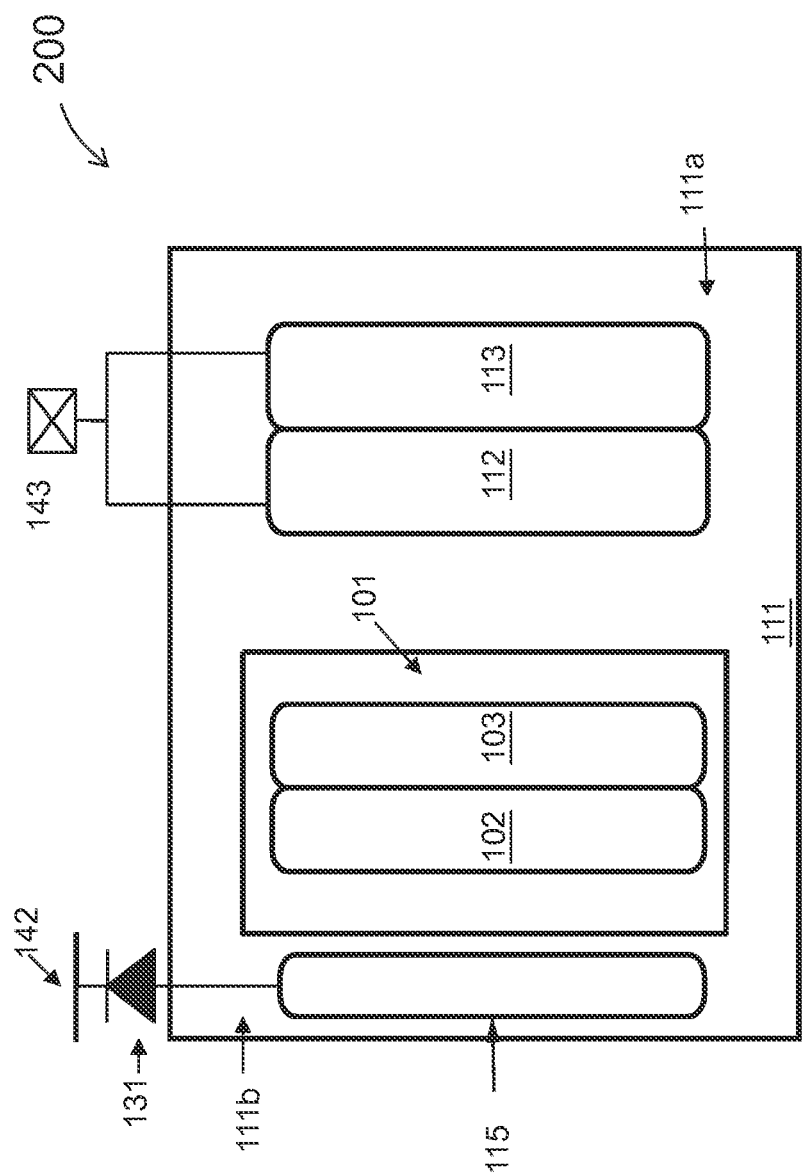
FIG. 2 is a simplified layout diagram of the LDMOS device of FIG. 1 according to an embodiment of the present invention.

FIG. 2 is a simplified layout diagram of the LDMOS device of FIG. 1 according to an embodiment of the present invention. This diagram is merely an example, which should not unduly limit the scope of the claims herein. In FIGS. 1 and 2, corresponding device regions are labeled with the same numerals. One of ordinary skill in the art would recognize other variations, modifications, and alternatives. As shown, the p-type well region 101 includes the first well contact 102 for coupling to a ground potential (not shown). The n-type source region 103 is located within the p-type well region. The n-type well region 111 is adjacent to the p-type well region 101 in FIG. 2, and the p-type well region 101 is shown to be surrounded by the n-type well region 111. An n-type drain region 112 is located within the n-type well region 111.

In an embodiment, the n-well region includes a first portion and a second portion. In FIGS. 1 and 2, the first portion 111a is the n-well region on the right-hand side of the figure, and the second portion 111b is the n-well region on the left-hand side of the figure. In a specific embodiment, the first portion and the second portion are contiguous regions, as shown in FIG. 2.

In FIG. 2, a p-type doped region 113 is disposed in the n-type well region 111. As shown, the p-type doped region 113 is adjacent to the drain region 112 and electrically coupled to the drain region 112. In some embodiments, the p-type doped region 113 may be positioned next to drain region 112, but in other embodiments, there can be a suitable distance between the p-type doped region 113 and the drain region 112 according to device or layout requirements. The n-type drain region 112 and the p-type doped region 113 are electrically connected to a pad 143. In FIG. 2, several n-type doped regions 115 provide contact regions for the portion of the n-type well region 111 which is close to the source region 103. Diode device 131 electrically connects the n-type doped regions 115 to a power supply potential 142 (VDD).

In FIG. 2, the p-type doped region 113, the first portion of the n-type well region 111a (not shown in FIG. 2) close to the drain region 112, and p-type well region 101 form a PNP transistor. Similarly, the drain region 112, the p-type well region 101 and the source region 103 form an NPN transistor. The various well regions and doped regions can be formed using conventional process technology. For example, doped regions 113 and 115 can be formed in an ion implantation process using appropriate p-type or n-type dopants. The operation of the transistors is discussed below with reference to the schematic diagram in FIG. 3.

Figure 3:
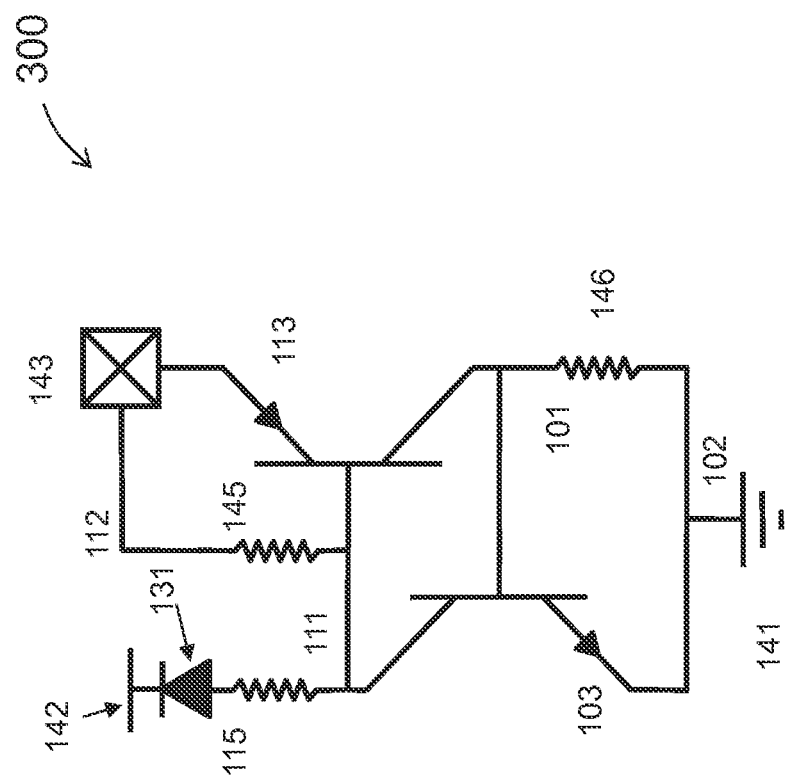
FIG. 3 is a simplified schematic diagram of the LDMOS device of FIG. 1 according to an embodiment of the present invention.

FIG. 3 is a simplified schematic diagram of the LDMOS device of FIG. 1 according to an embodiment of the present invention. This diagram is merely an example, which should not unduly limit the scope of the claims herein. One of ordinary skill in the art would recognize other variations, modifications and alternatives. As shown, the p-type doped region 113, the n-type well region 111, and the p-type well region 101 form a PNP transistor. Similarly, the n-type well region 111, the p-type well region 101, and the source region 103 form an NPN bipolar transistor. Resistor 145 represents the resistance in the n-type well region, and resistor 146 represents the resistance in the p-type well region. The p-type doped region 113 is connected to pad 143, and the n-type doped region 115 is electrically connected to the diode 131 (D1). In an embodiment, the diode 131 can be formed as a PN junction diode including two doped semiconductor regions. In an alternative embodiment, the diode 131 can be a Schottky diode including a metal and a semiconductor.

In a specific embodiment, the invention provides a technique that utilizes PN forward diode to provide a current path for an pnp current flown into P type substrate which raises the substrate voltage and helps NPN or SCR being turned on while having an ESD event. The switch and power supply provide a path for PN diode.

When an ESD event occurs, a high voltage pulse appears on pad 143. A current may flow through the p-type doped region 113, the n-type well region 111, n-type doped region 115, and diode 131. The PNP transistor is turned on, and a forward bias is provided between the base terminal and the collector terminal of the NPN transistor. A current path is established from the n-type well region 111, through the p-type well region 101, and n-type source region 103 to the source terminal 141. As a result, the NPN transistor is triggered and the ESD current can be directed from the NPN transistor to the source or ground terminal 141. This conduction mechanism does not rely on avalanche breakdown between the n-type well and the p-type well. Therefore, this current conduction is enabled at a lower trigger voltage than conventional npn and SCR structures, providing better device protection against ESC events. In a specific embodiment, the trigger voltage of about 24V has been obtained according to an embodiment of the invention. Of course, there can be other variations, modifications, and alternatives.

Figure 4:
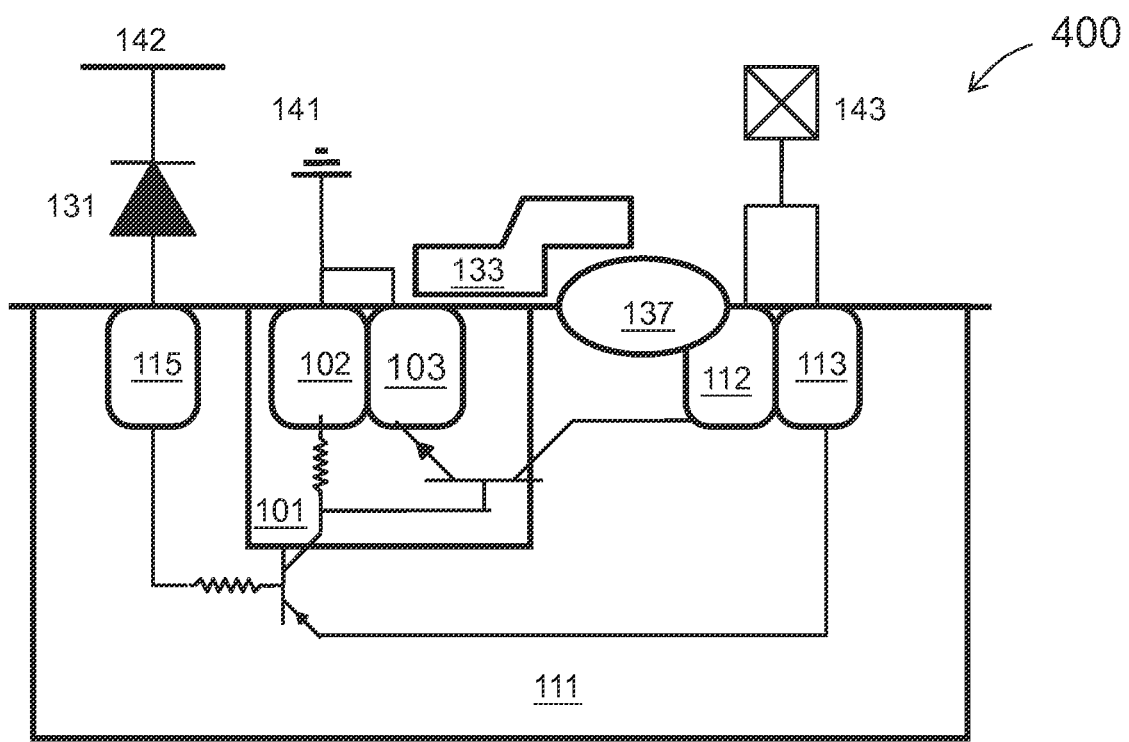
FIG. 4 is a simplified cross-sectional view diagram of the LDMOS device according to another embodiment of the present invention.

FIG. 4 is a simplified cross-sectional view diagram of the LDMOS device 400 according to another embodiment of the present invention. This diagram is merely an example, which should not unduly limit the scope of the claims herein. One of ordinary skill in the art would recognize other variations, modifications, and alternatives. As shown, LDMOS device 400 is similar to the LDMOS device 100 of FIG. 1, with a different well arrangement. As shown, p-well 101 is now formed inside n-well 111. Otherwise, the operation of LDMOS device 400 is similar to that of LDMOS device 100 discussed above. In particular, a PNP transistor and an NPN transistor provide an ESD current path having a lower trigger voltage than conventional NPN and SCR devices.

As shown in FIG. 4, according to some embodiments, a semiconductor device 400 includes a first well region 111 of a first conductivity type, a second well region 101 of a second conductive type within the first well region 111. In some embodiments, the first conductivity type is n-type, and the second conductivity type is p-type. In other embodiments, the conductivity types can be reversed. In FIG. 4, a first region 103 of the first conductivity type and a second region 102 of the second conductivity type are disposed within the second well region 101. A third region 115 of the first conductivity type and a fourth region 113 of the second conductivity type are disposed within the first well region 111, wherein the third region 115 and the fourth region 113 are separated by the second well region 101. The semiconductor device 400 also includes a switch device 131 coupled to the third region 115.

In this example, a PNP transistor (formed by regions 113, 111, and 101) and an NPN transistor (formed by regions 111, 101, and 103) provide an ESD current path having a lower trigger voltage than conventional ESD devices. Similar ESD devices arrangements are also shown in FIGS. 5, 11, 12, 15, and 18 described below.

Figure 5:
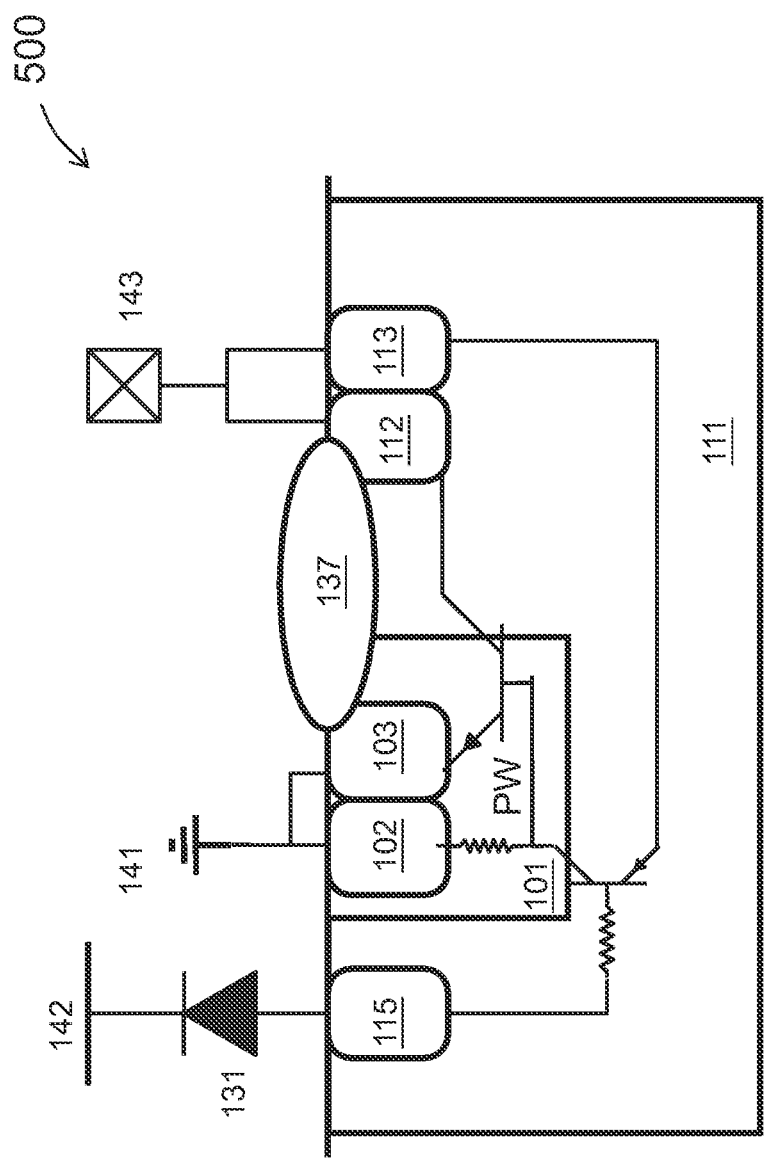
FIG. 5 is a simplified cross-sectional view of a high voltage field transistor according to an embodiment of the present invention.

FIG. 5 is a simplified cross-sectional view of a high voltage field transistor according to an embodiment of the present invention. This diagram is merely an example, which should not unduly limit the scope of the claims herein. One of ordinary skill-in the art would recognize other variations, modifications, and alternatives. As shown, field transistor 500 is similar to the LDMOS device 400 of FIG. 4, with a different gate arrangement. As shown, the field oxide 137 forms the gate dielectric of the high voltage field transistor. Otherwise, the ESD protection operation of field transistor 500 is similar to that of LDMOS devices 400 and 100 discussed above. In particular, a PNP and an NPN transistors provide an ESD current path having a lower trigger voltage than conventional NPN and SCR devices.

Figure 6:
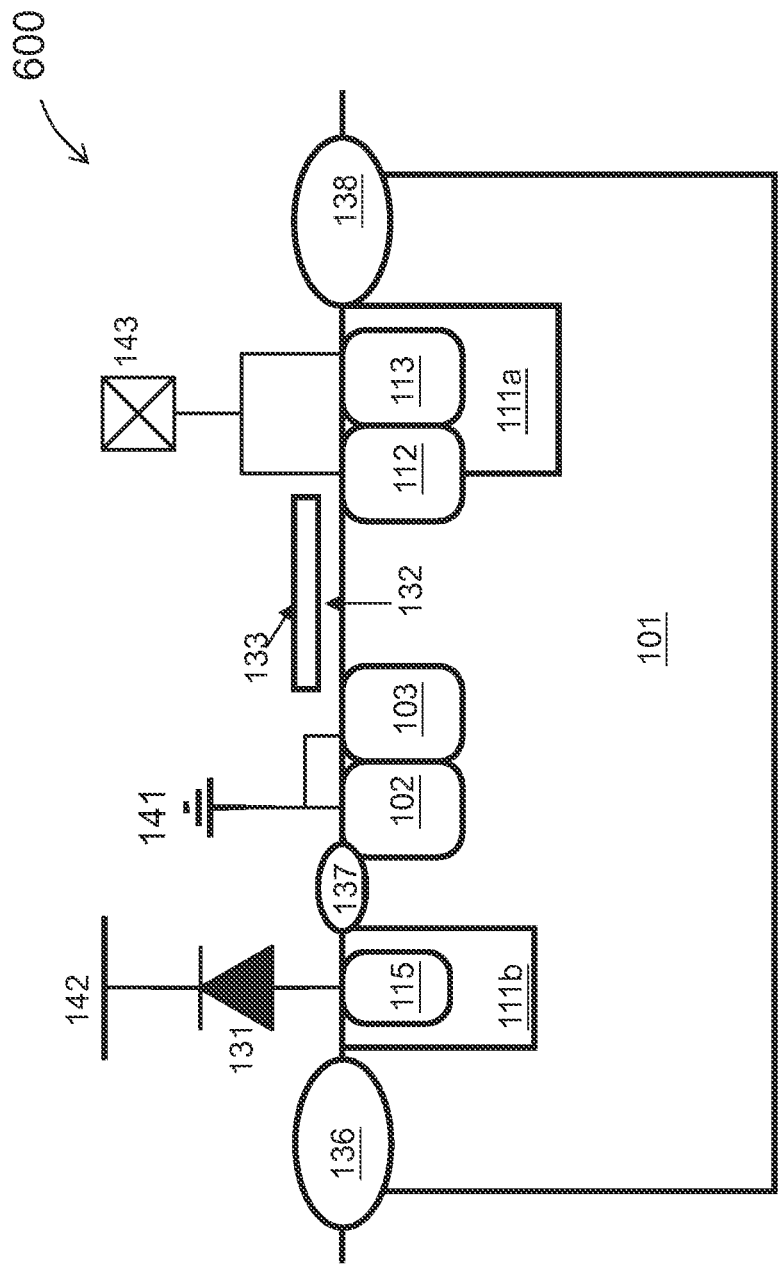
FIG. 6 is a simplified cross-sectional view diagram of a low voltage MOS device according to another embodiment of the present invention.

FIG. 6 is a simplified cross-sectional view diagram of a low voltage MOSFET device according to another embodiment of the present invention. This diagram is merely an example, which should not unduly limit the scope of the claims herein. One of ordinary skill in the art would recognize other variations, modifications, and alternatives. As shown, low voltage MOSFET 600 is similar to the LDMOS device 100 of FIG. 1, with low voltage MOSFET replacing the LDMOS. As shown, gate 133 now overlies gate dielectric 132, and drain region 112 resides partly in the p-type well 101 and partly in the n-type well 111. Otherwise, the ESD protection operation of LDMOS device 400 is similar to that of LDMOS device 100 discussed above. In particular, a PNP and an NPN transistors provide an ESD current path having a lower trigger voltage than conventional npn and SCR devices.

Figure 7:
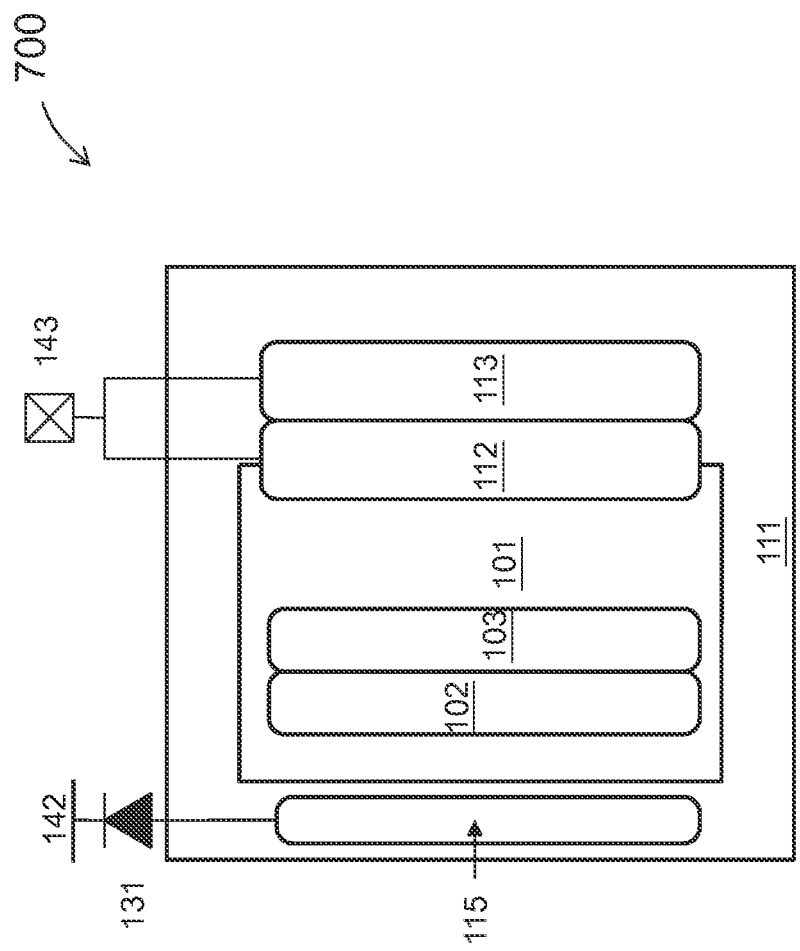
FIG. 7 is a simplified layout diagram of a low voltage MOSFET device of FIG. 6 according to an embodiment of the present invention.

FIG. 7 is a simplified layout diagram of a low voltage MOSFET device of FIG. 6 according to an embodiment of the present invention. This diagram is merely an example, which should not unduly limit the scope of the claims herein. One of ordinary skill in the art would recognize other variations, modifications, and alternatives. As shown, the layout diagram is similar to the layout diagram of FIG. 2 for LDMOS device 100 with drain region 112 now residing partly in the p-type well 101 and partly in the n-type well 111.

Figure 8:
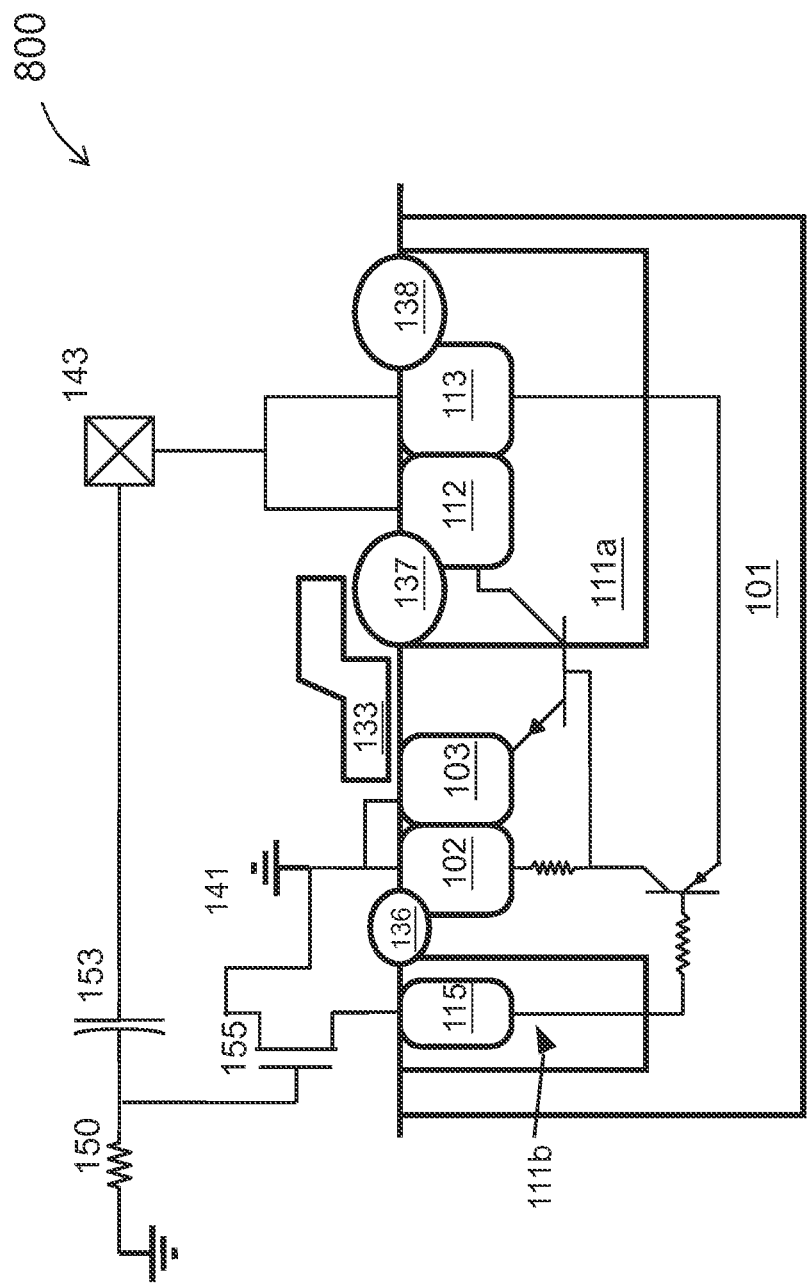
FIG. 8 is a simplified cross-sectional view diagram of an LDMOS device according to another embodiment of the present invention.

FIG. 8 is a simplified cross-section view diagram of an LDMOS device according to another embodiment of the present invention. This diagram is merely an example, which should not unduly limit the scope of the claims herein. One of ordinary skill in the art would recognize other variations, modifications, and alternatives. As shown, LDMOS device 800 is similar to LDMOS device 100 of FIG. 1, with an RC-triggered MOSFET replacing the diode as the switch device coupled to an ESD current path. In FIG. 8, an ESD current path is provided by an RC triggered MOSFET, including resistor 150, capacitor 153, and n-type MOSFET 155. According to embodiments of the invention, the resistance of the resistor 150 and the capacitance of 153 are selected such that MOSFET 155 is turned on by the high voltage pulse of an ESD event, providing a current path from the pad through the parasitic forward diode and also through MOSFET 155 to a ground potential. During normal device operation, MOSFET 155 remains turned off, and no current flows through MOSFET 155. During ESD event, p-type doped region 113, n-type well region 111, n-type doped region 115, and the RC-triggered MOSFET provide a current path. This specific embodiment utilizes PN forward diode to provide a pnp current flown into P type substrate which raises the substrate voltage and helps npn or SCR being turned on while having an ESD event. The switch and power supply provide a path for PN diode. While an ESD event exists, RC is coupled to the voltage of PAD and MOS is turned on. PNP current path has been formed.

This current flow provides a positive bias at the base-collector junction of NPN transistor formed by n-type well region 111, p-type well region 101, and n-type doped region 103. The NPN transistor is then triggered to provide a current path for the ESC current. As discussed above, this design enables a reduced trigger voltage than conventional npn and SCR devices. In an embodiment, MOSFET 155, resistor 150, and capacitor 153 can be formed in the same semiconductor substrate as the LDMOS using conventional integrated circuit process technology.

Figure 9:
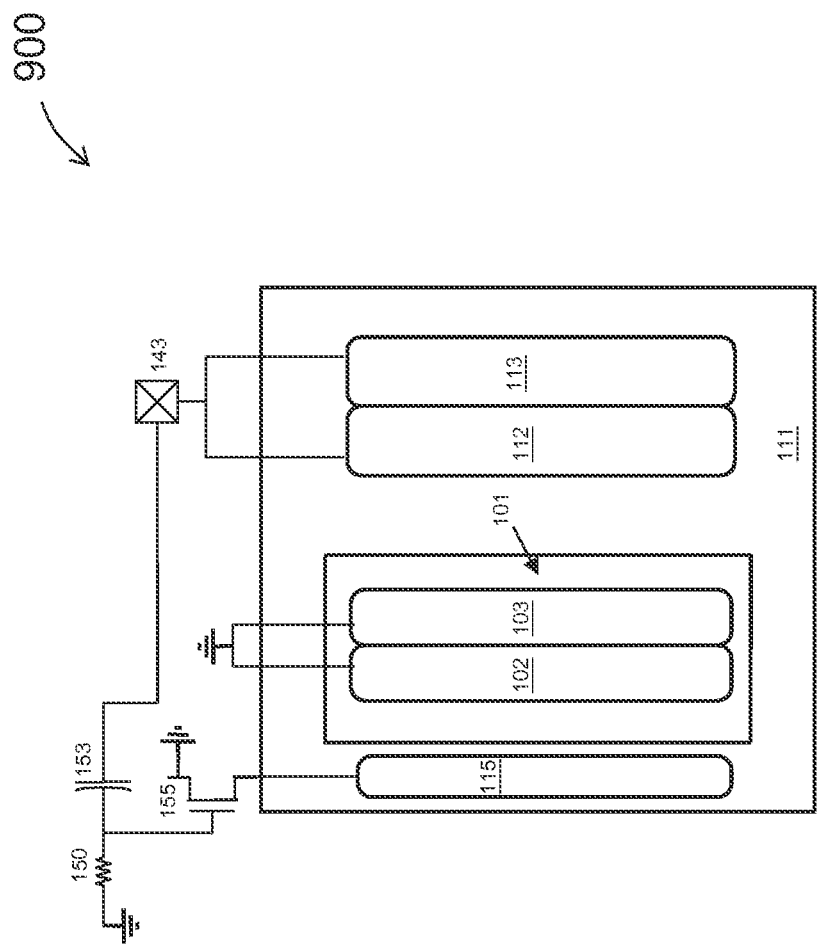
FIG. 9 is a simplified layout diagram of the LDMOS device of FIG. 8 according to an embodiment of the present invention.

FIG. 9 is a simplified layout diagram of the LDMOS device of FIG. 8 according to an embodiment of the present invention. This diagram is merely an example, which should not unduly limit the scope of the claims herein. One of ordinary skill in the art would recognize other variations, modifications, and alternatives. As shown, the layout diagram in FIG. 9 is similar to the layout diagram in FIG. 2, with an RC-triggered MOSFET replacing the diode as the switch device coupled to an ESD current path.

Figure 10:
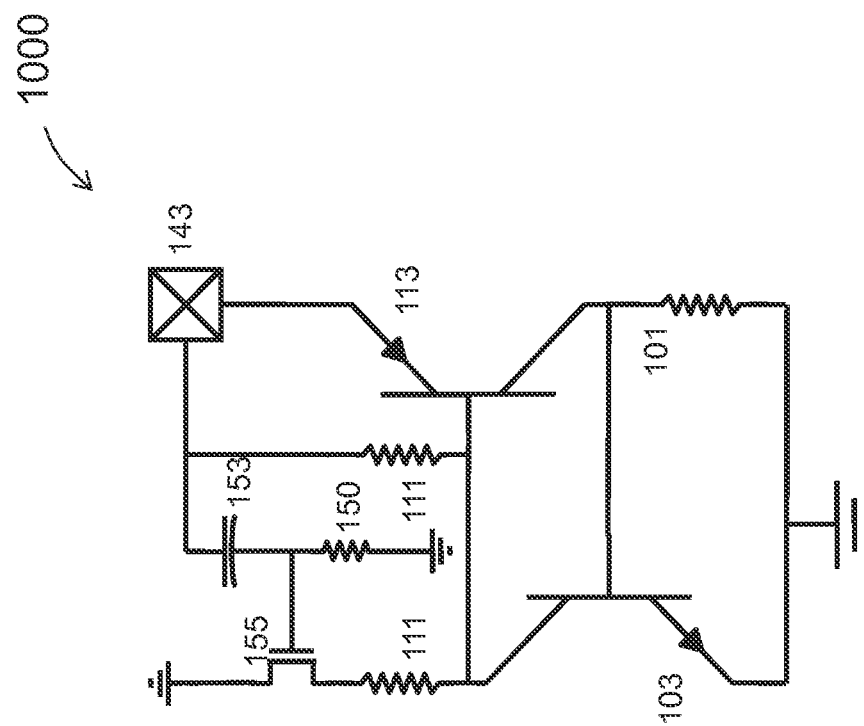
FIG. 10 is a simplified schematic diagram of the LDMOS device of FIG. 8 according to an embodiment of the present invention.

FIG. 10 is a simplified schematic diagram of the LDMOS device of FIG. 8 according to an embodiment of the present invention. This diagram is merely an example, which should not unduly limit the scope of the claims herein. One of ordinary skill in the art would recognize other variations, modifications, and alternatives. As shown, the schematic diagram in FIG. 10 is similar to the schematic diagram in FIG. 3, with an RC-triggered MOSFET replacing the diode as the switch device coupled to an ESD current path.

Figure 11:
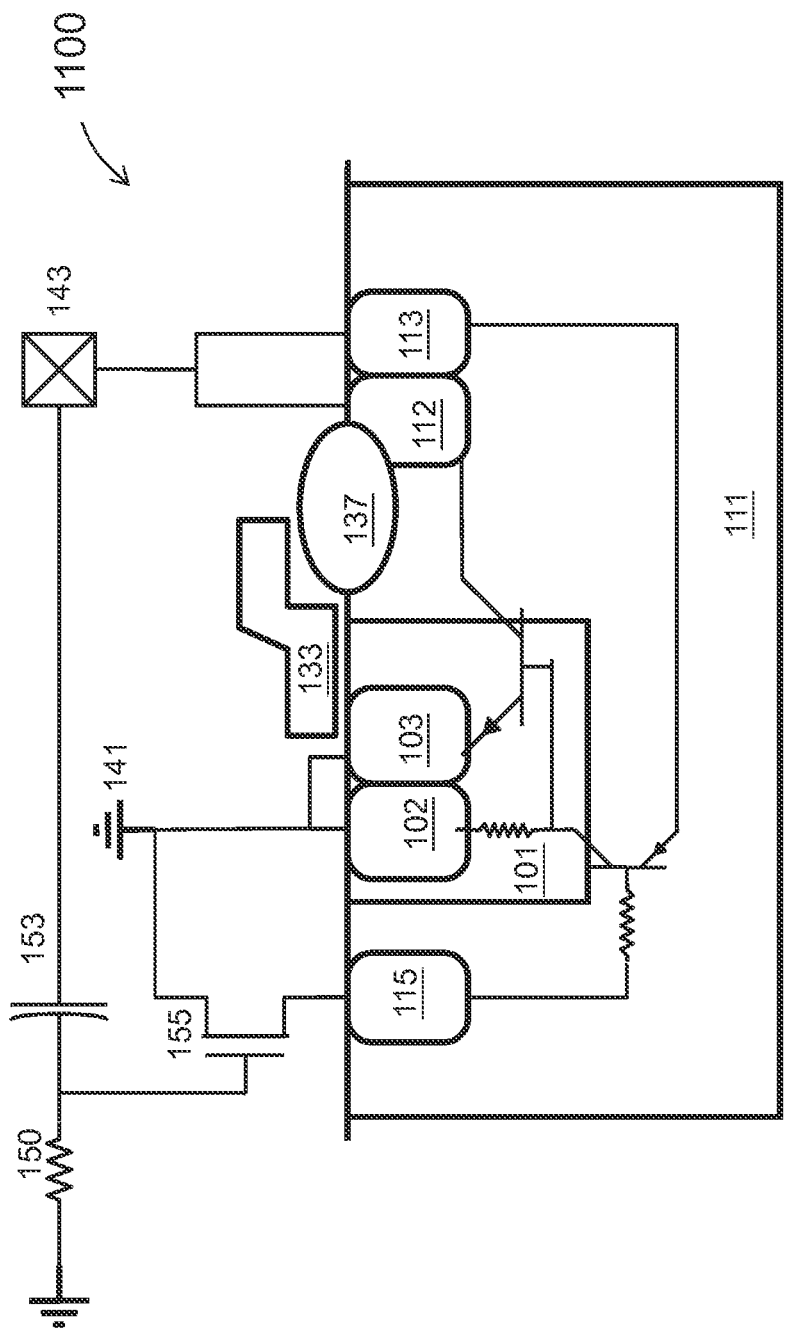
FIG. 11 is a simplified cross-sectional view diagram of an LDMOS device according to an alternative embodiment of the present invention.

FIG. 11 is a simplified cross-sectional view diagram of an LDMOS device according to an alternative embodiment of the present invention. This diagram is merely an example, which should not unduly limit the scope of the claims herein. One of ordinary skill in the art would recognize other variations, modifications, and alternatives. As shown, LDMOS device 1100 is similar to the LDMOS device 400 of FIG. 4, with an RC-triggered MOSFET replacing the diode as the switch device coupled to the current path. The ESD protection operation of LDMOS device 1100 is similar to that LDMOS device 800 discussed above. In particular, two transistors provide an ESD current path having a lower trigger voltage than conventional npn and SCR devices.

Figure 12:
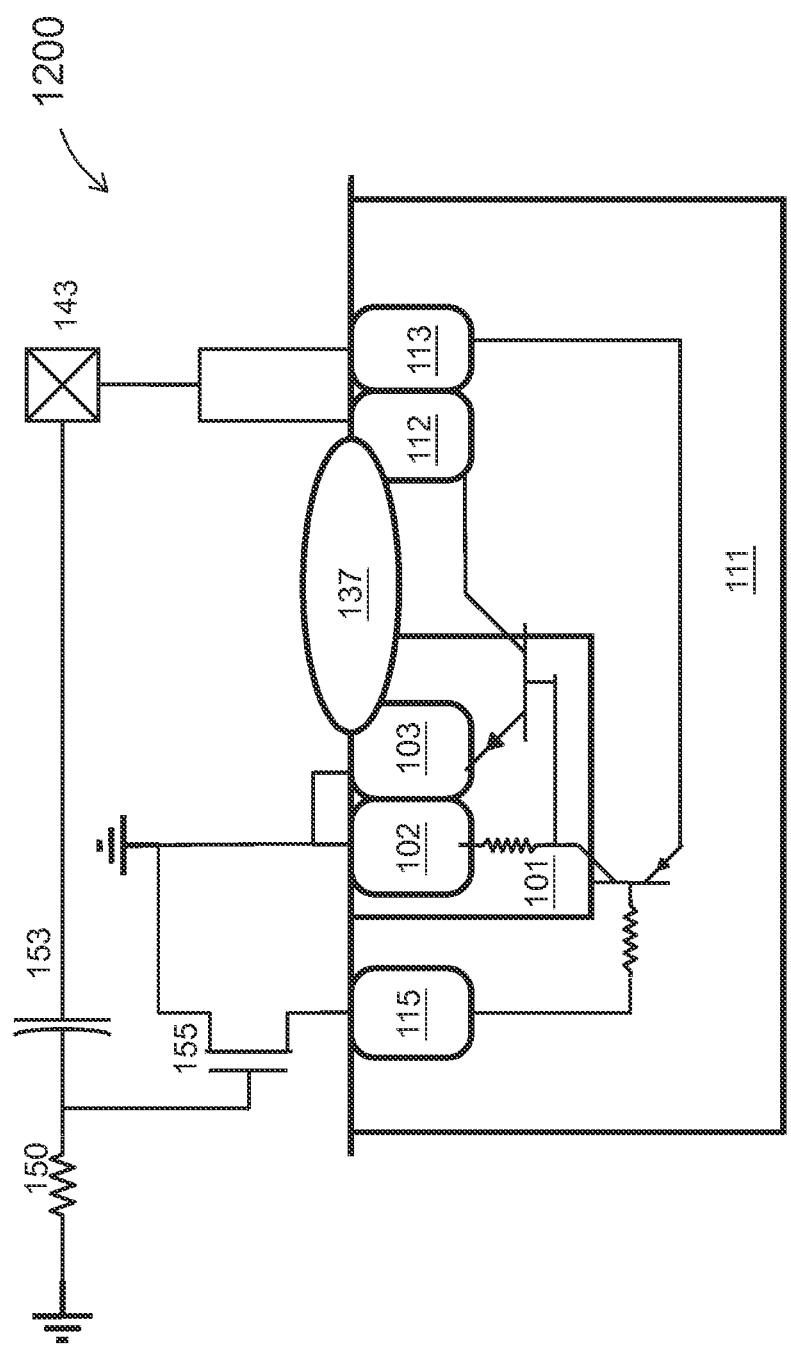
FIG. 12 is a simplified cross-sectional view diagram of a high voltage field transistor of FIG. 11 according to another embodiment of the present invention.

FIG. 12 is a simplified cross-sectional view diagram of a high voltage field transistor of FIG. 11 according to another embodiment of the present invention. This diagram is merely an example, which should not unduly limit the scope of the claims herein. One of ordinary skill in the art would recognize other variations, modifications, and alternatives. As shown, field transistor 1200 is similar to the field transistor 500 of FIG. 5, with an RC-triggered MOSFET replacing the diode as the switch device coupled to an ESD current path. The ESD protection operation of field transistor 1200 is similar to that of LDMOS device 800 discussed above. In particular, a transistor provides an ESD current path having a lower trigger voltage than conventional npn and SCR devices.

Figure 13:
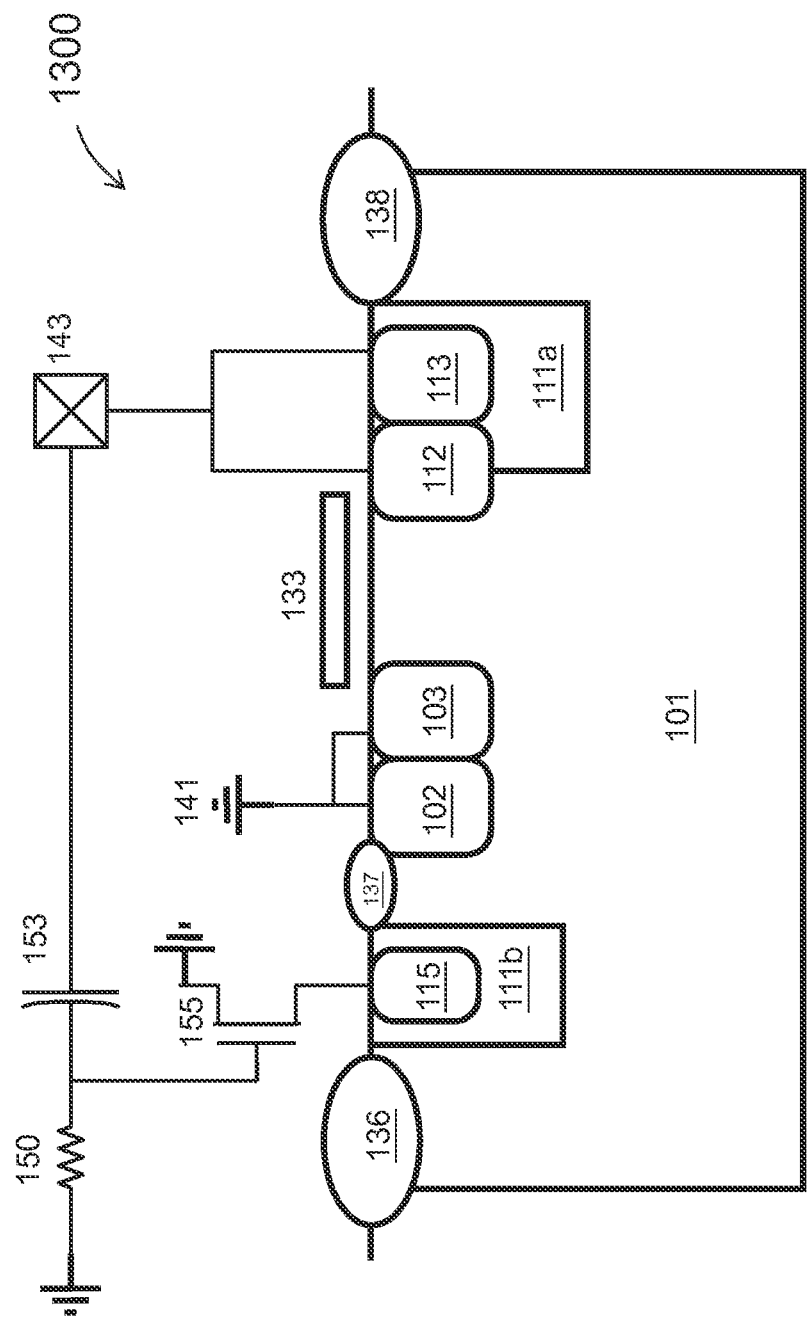
FIG. 13 is a simplified cross-sectional view diagram of a low voltage MOSFET device according to another embodiment of the present invention.

FIG. 13 is a simplified cross-sectional view diagram of a low voltage MOSFET device according to another embodiment of the present invention. This diagram is merely an example, which should not unduly limit the scope of the claims herein. Once of ordinary skill in the art would recognize other variations, modifications, and alternatives. As shown, low voltage MOSFET device 1300 is similar to the low voltage MOSFET device 600 of FIG. 6, with an RC-triggered MOSFET replacing the diode as the switch device coupled to an ESD current path. The ESC protection operation of low voltage MOSFET device 1300 is similar to that of LDMOS device 800 discussed above. In particular, two transistors provide an ESD current path having a lower trigger voltage than conventional npn and SCR devices.

Figure 14:
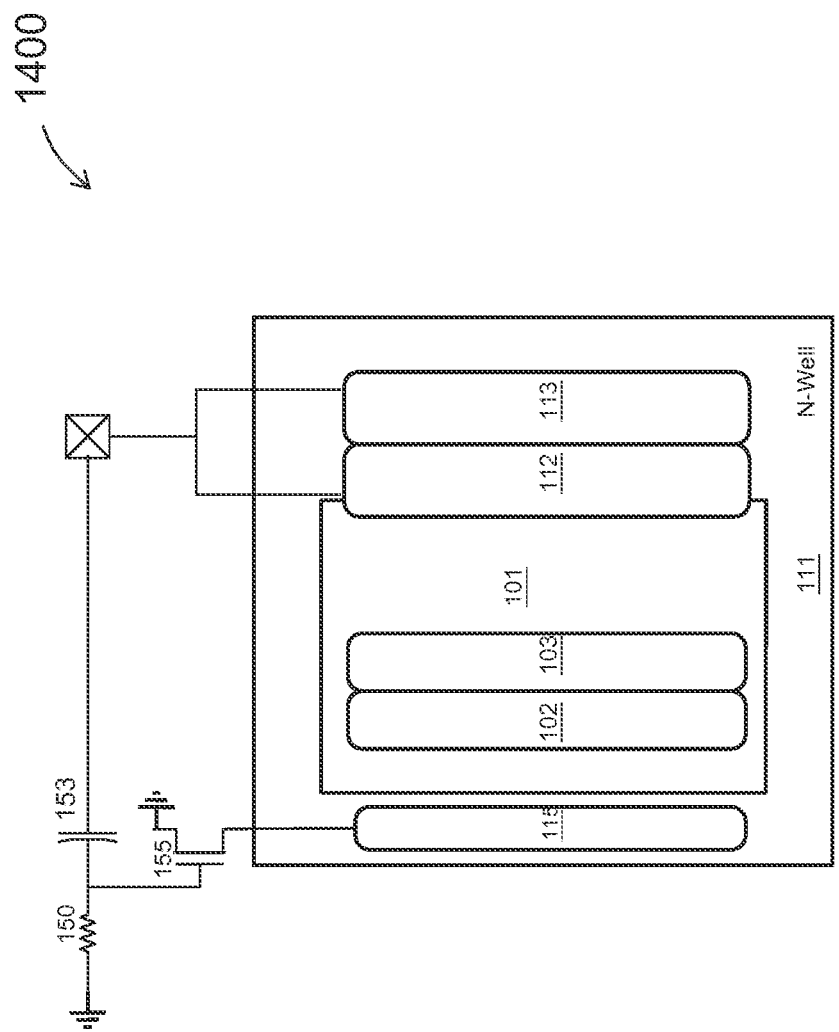
FIG. 14 is a simplified layout diagram of the low voltage MOSFET device of FIG. 13 according to an embodiment of the present invention.

FIG. 14 is a simplified layout diagram of the low voltage MOSFET device of FIG. 13 according to an embodiment of the present invention. This diagram is merely an example, which should not unduly limit the scope of the claims herein. One of ordinary skill in the art would recognize other variations, modifications, and alternatives. As shown, the layout diagram for low voltage MOSFET device 1300 is similar to the layout diagram in FIG. 7 for the low voltage MOSFET device 600 of FIG. 6, with an RC-triggered MOSFET replacing the diode as the switch device.

Figure 15:
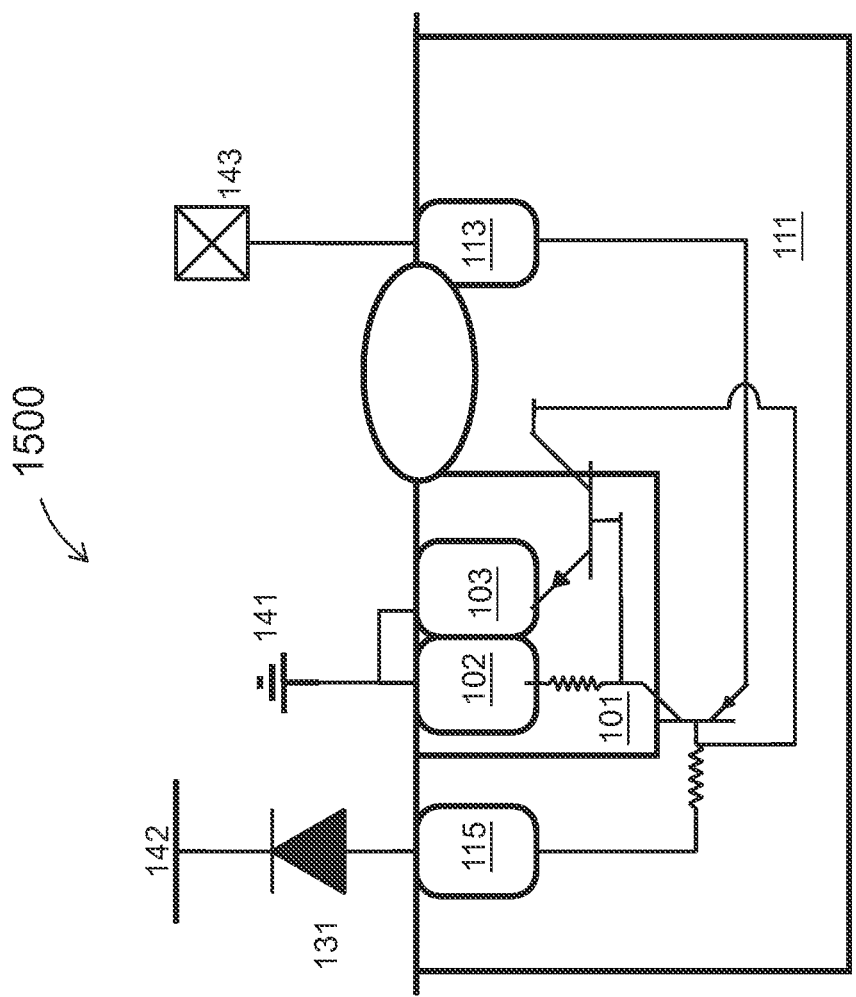
FIG. 15 is a simplified cross-sectional view diagram of a high voltage field transistor according to another embodiment of the present invention.

FIG. 15 is a simplified cross-sectional view diagram of a high voltage field transistor according to another embodiment of the present invention. This diagram is merely an example, which should not unduly limit the scope of the claims herein. One of ordinary skill in the art would recognize other variations, modifications, and alternatives. As shown, field transistor 1500 is similar to the field transistor 500 of FIG. 5, without the field oxide region 137 and the n-type drain region 112.

Figure 16:
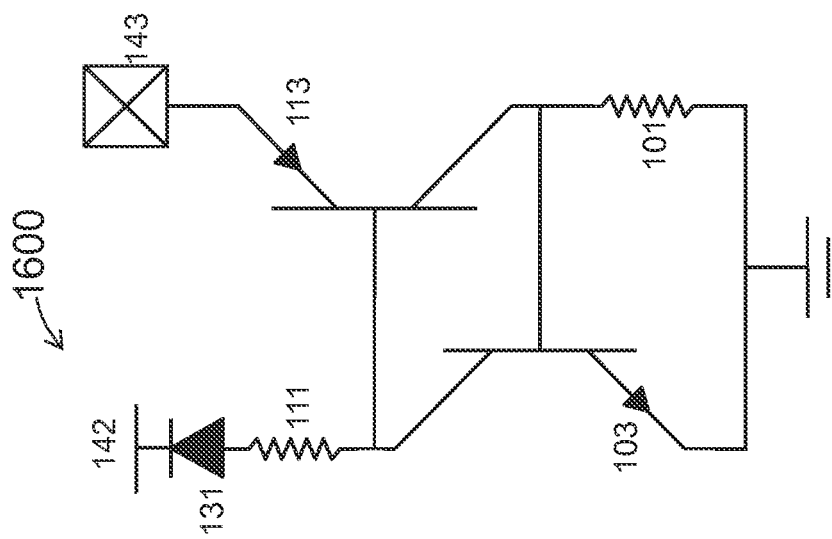
FIG. 16 is a simplified schematic diagram of FIG. 15 according to an embodiment of the present invention.

FIG. 16 is a simplified schematic diagram of the high voltage field device of FIG. 15 according to an embodiment of the present invention. This diagram is merely an example, which should not unduly limit the scope of the claims herein. One of ordinary skill in the art would recognize other variations, modifications and alternatives. As shown, the p-type doped region 113, the n-type well region 111, and the p-type well region 101 form a PNP transistor. Similarly, the n-type well region 111, the p-type well region 101, and the source region 103 form an NPN bipolar transistor. The p-type doped region 113 is connected to pad 143, and the n-type doped region 115 is electrically connected to the diode 131 (D1). In an embodiment, the diode 131 can be formed as a PN junction diode including two doped semiconductor regions. In an alternative embodiment, the diode 131 can be a Schottky diode including a metal and a semiconductor.

When an ESD event occurs, a high voltage pulse appears on pad 143. A current may flow through the p-type doped region 113, the n-type well region 111, n-type doped region 115, and diode 131. The PNP transistor is turned on, and a forward bias is provided between the base terminal and the collector terminal of the NPN transistor. A current path is established from the n-type well region 111, through the p-type well region 101, and n-type source region 103 to the source terminal 141. As a result, the NPN transistor is triggered and the ESD current can be directed from the NPN transistor to the source or ground terminal 141. This conduction mechanism does not rely on avalanche breakdown between the n-type well and the p-type well. Therefore, this current conduction is enabled at a lower trigger voltage than conventional npn and SCR structures, providing better device protection against ESC events. In a specific embodiment, the trigger voltage of about 24V has been obtained according to an embodiment of the invention. Of course, there can be other variations, modifications, and alternatives.

Figure 17:
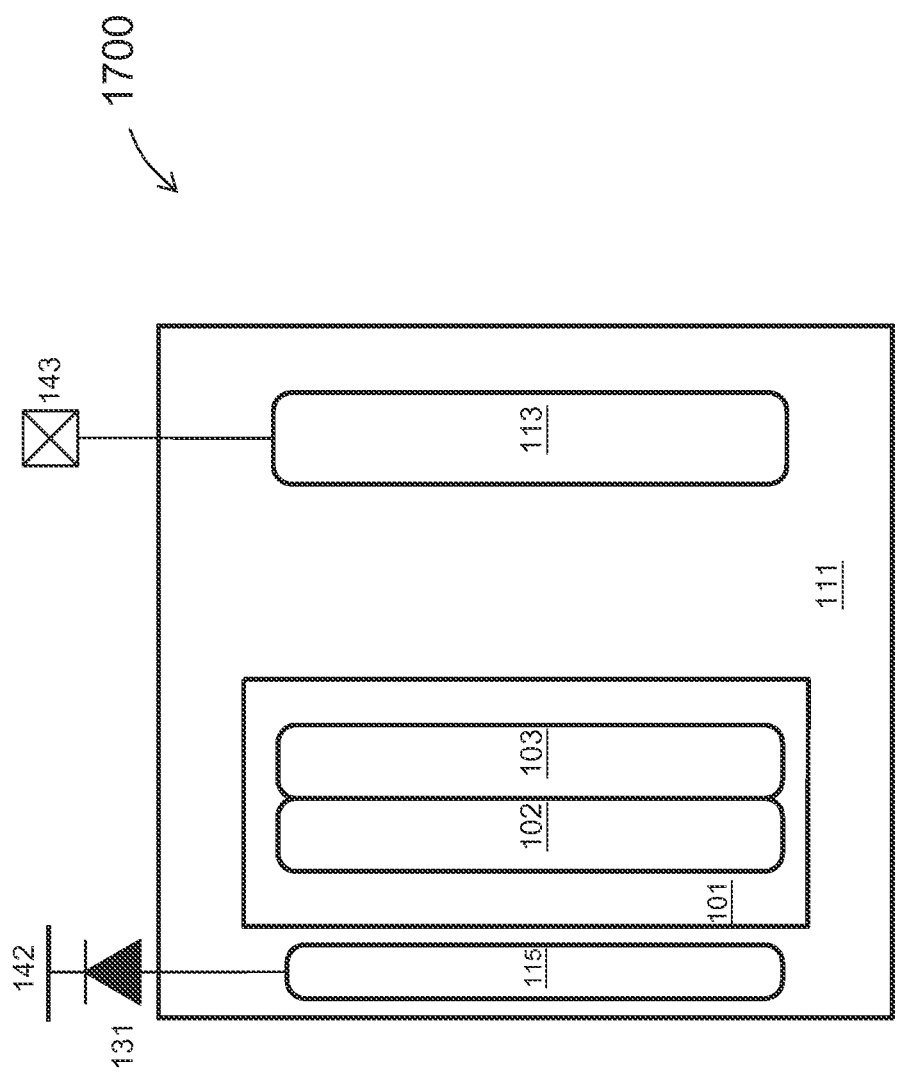
FIG. 17 is a simplified layout diagram of the high voltage field transistor of FIG. 15 according to an embodiment of the present invention.

FIG. 17 is a simplified layout diagram of the high voltage field device of FIG. 15 according to an embodiment of the present invention. This diagram is merely an example, which should not unduly limit the scope of the claims herein. In FIGS. 15 and 17, corresponding device regions are labeled with the same numerals. One of ordinary skill in the art would recognize other variations, modifications, and alternatives. As shown, the p-type well region 101 includes the first well contact 102 for coupling to a ground potential (not shown). The n-type source region 103 is located within the p-type well region 101. The n-type well region 111 is adjacent to the p-type well region 101 in FIG. 17, and the p-type well region 101 is shown to be surrounded by the n-type well region 111.

Figure 18:
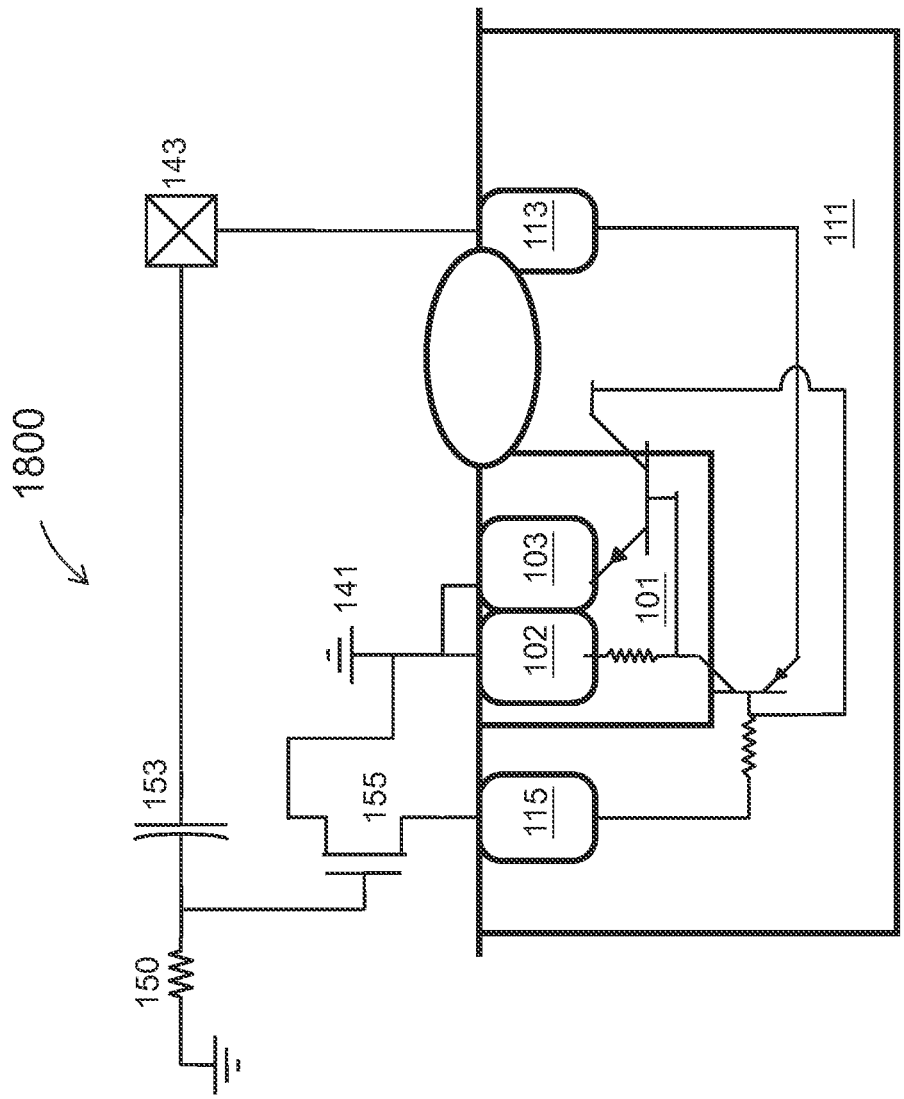
FIG. 18 is a simplified cross-section view diagram of the high voltage field device according to another embodiment of the present invention.

FIG. 18 is a simplified cross-section view diagram of a high voltage field device according to another embodiment of the present invention. This diagram is merely an example, which should not unduly limit the scope of the claims herein. One of ordinary skill in the art would recognize other variations, modifications, and alternatives. As shown, LDMOS device 1800 is similar to LDMOS device 1500 of FIG. 15, with an RC-triggered MOSFET replacing the diode as the switch device coupled to an ESD current path. In FIG. 18, an ESD current path is provided by an RC triggered MOSFET, including resistor 150, capacitor 153, and n-type MOSFET 155. According to embodiments of the invention, the resistance of the resistor 150 and the capacitance of 153 are selected such that MOSFET 155 is turned on by the high voltage pulse of an ESD event, providing a current path from the pad through the parasitic forward diode and also through MOSFET 155 to a ground potential. During normal device operation, MOSFET 155 remains turned off, and no current flows through MOSFET 155. During ESD event, p-type doped region 113, n-type well region 111, n-type doped region 115, and the RC-triggered MOSFET provide a current path. This specific embodiment utilizes PN forward diode to provide a pnp current flown into P type substrate which raises the substrate voltage and helps npn or SCR being turned on while having an ESD event. The switch and power supply provide a path for PN diode. While an ESD event exists, RC is coupled to the voltage of PAD and MOS is turned on. PNP current path has been formed.

This current flow provides a positive bias at the base-collector junction of NPN transistor formed by n-type well region 111, p-type well region 101, and n-type doped region 103. The NPN transistor is then triggered to provide a current path for the ESC current. As discussed above, this design enables a reduced trigger voltage than conventional npn and SCR devices. In an embodiment, MOSFET 155, resistor 150, and capacitor 153 can be formed in the same semiconductor substrate as the LDMOS using conventional integrated circuit process technology.

Figure 19:
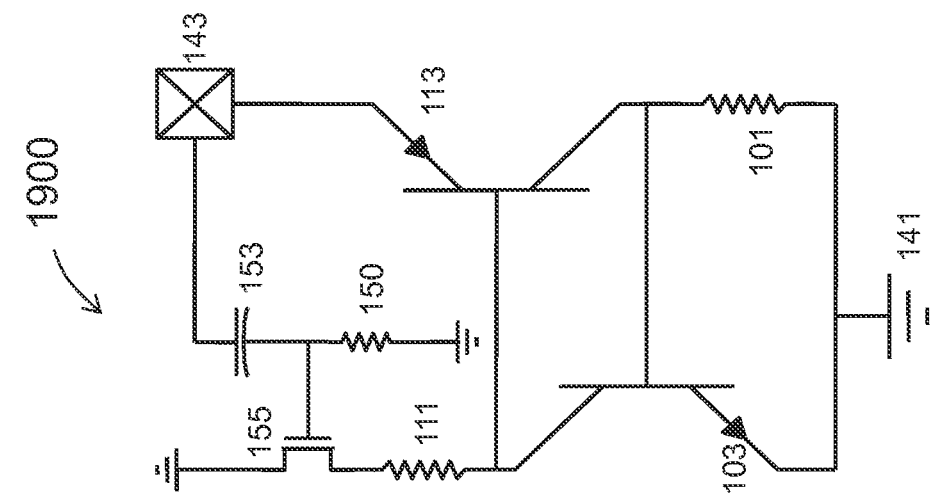
FIG. 19 is a simplified schematic diagram of the high voltage field device of FIG. 18 according to an embodiment of the present invention.

FIG. 19 is a simplified schematic diagram of the high voltage field device of FIG. 18 according to an embodiment of the present invention. This diagram is merely an example, which should not unduly limit the scope of the claims herein. One of ordinary skill in the art would recognize other variations, modifications, and alternatives. As shown, the schematic diagram in FIG. 19 is similar to the schematic diagram in FIG. 16, with an RC-triggered MOSFET replacing the diode as the switch device coupled to an ESD current path.

Figure 20:
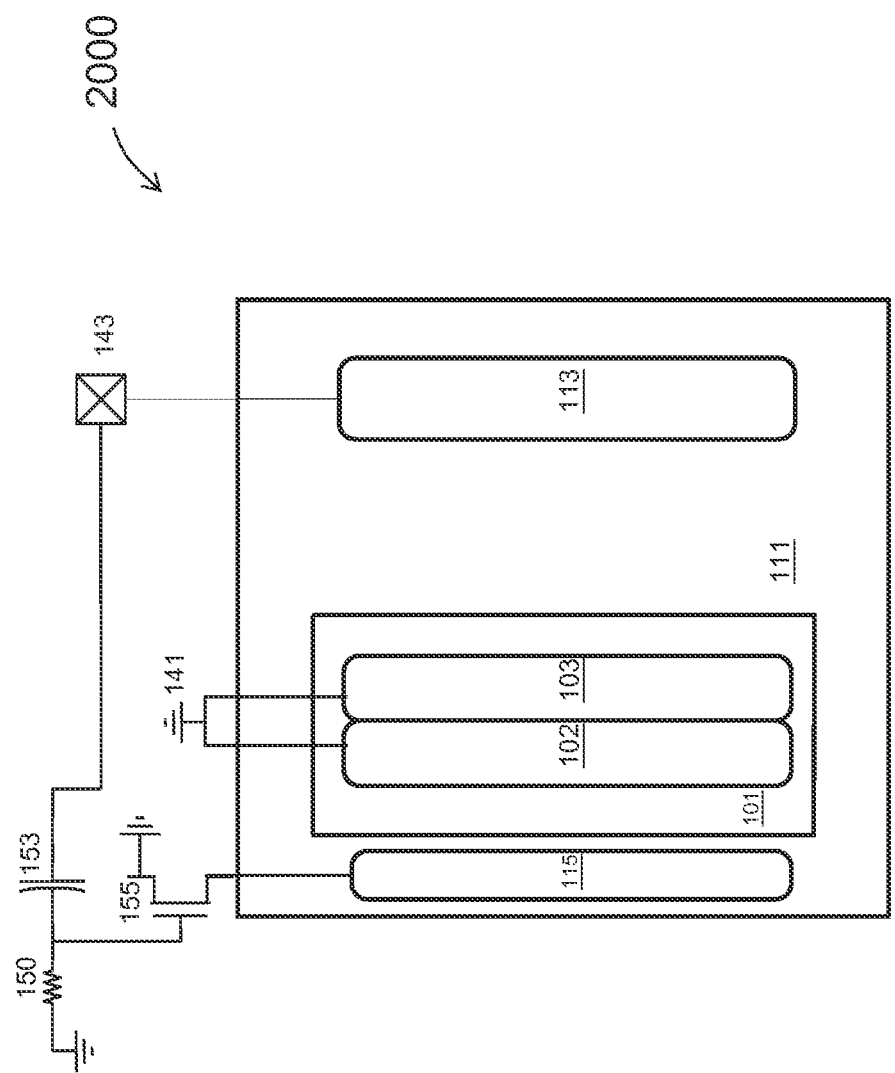
FIG. 20 is a simplified layout diagram of the high voltage device of FIG. 18 according to an embodiment of the present invention.

FIG. 20 is a simplified layout diagram of the high voltage field device of FIG. 18 according to an embodiment of the present invention. This diagram is merely an example, which should not unduly limit the scope of the claims herein. One of ordinary skill in the art would recognize other variations, modifications, and alternatives. As shown, the layout diagram in FIG. 20 is similar to the layout diagram in FIG. 17, with an RC-triggered MOSFET replacing the diode as the switch device coupled to an ESD current path.

Although the above has been shown using a selected group of components for providing ESD protection structures having reduced trigger voltages, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A semiconductor device, comprising:
a first well region of a first conductivity type;
a second well region of a second conductive type within the first well region;
a first region of the first conductivity type within the second well region;
a second region of the second conductivity type within the second well region;
a third region of the first conductivity type within the first well region;
a fourth region of the second conductivity type within the first well region, wherein the third region and the fourth region are separated by the second well region; and
a switch device coupled to the third region, the switch device not directly coupled to the fourth region.

2. The semiconductor device of claim 1, wherein the first region and the second well region form a diode, and the first region, the second well region, and the first well form a bipolar transistor.

3. The semiconductor device of claim 1, wherein the fourth region and the first well region form a diode, and the second well region, the first well region, and the fourth region form a bipolar transistor.

4. The semiconductor device of claim 1, wherein the fourth region and the first well region form a diode, and the fourth region, the first well region, the second well region, and the first region form a silicon controlled rectifier (SCR).

5. The semiconductor device of claim 1, wherein the first region and the second region are coupled to a first potential, and the switch device is coupled to a second potential.

6. The semiconductor device of claim 5, wherein the first potential is different from the second potential.

7. The semiconductor device of claim 1 wherein the first conductivity type is n-type, and the second conductivity type is p-type.

8. The semiconductor device of claim 5, wherein the first potential is a ground potential.

9. The semiconductor device of claim 1 wherein the switch device comprises a diode, a first terminal of the diode being coupled to the third region and a second terminal of the diode being coupled to the second potential.

10. The semiconductor device of claim 1 wherein the switch device comprises a MOSFET, a first terminal of the MOSFET being coupled to the third region and a second terminal of the MOSFET being coupled to the first potential.

11. The semiconductor device of claim 10 wherein a gate terminal of the MOSFET is electrically coupled to the fourth region through a capacitor and electrically coupled to the first potential through a resistor.

12. The semiconductor device of claim 1 further comprises a fifth region of the second conductivity type, the fifth region being electrically coupled to the fourth region.

13. The semiconductor device of claim 12, wherein the semiconductor device comprises a lateral double diffused MOSFET (LDMOS), the LDMOS including:

a channel region in the second well region;
a gate dielectric overlying the channel region;
an isolation region between the channel region and the fifth region; and
a gate overlying the gate dielectric and the isolation region.

14. The semiconductor device of claim 12, wherein the semiconductor device comprises a field transistor, the field transistor including an isolation region between the first region and the fifth region.

15. The semiconductor device of claim 12, wherein the semiconductor device comprises a MOSFET, the MOSFET further comprising:
   a channel region in the first well region between the first region and the fifth region;
   a gate dielectric overlying the channel region; and a gate overlying the gate dielectric,
   wherein at least a portion of the fifth region is within the first well region.

16. A semiconductor device, comprising:
   an n-type first well;
   a p-type second well region within the n-type first well region;
   an n-type first region within the p-type second well region;
   a p-type second region within the p-type second well region;
   an n-type third region within the n-type first well region;
   a p-type fourth region within the n-type first well region, wherein the n-type third region and the p-type fourth region are separated by the p-type second well region;
   a switch device coupled to the third region; and
   a contact pad coupled to the fourth region,
   the semiconductor device being configured to provide a conduction path from the contact pad to a power supply or a ground potential for electrostatic discharge (ESD) protection.

17. The semiconductor device of claim 16, wherein the n-type first region and the p-type second region are coupled to a first potential, and the switch device is coupled to a second potential.

18. The semiconductor device of claim 16, wherein the p-type fourth region and the n-type first well region form a PN diode, and the p-type fourth region, the n-type first well region and the p-type second well form a PNP bipolar transistor.

19. The semiconductor device of claim 16, wherein the p-type second well region and the n-type first region form a PN diode, and the n-type first well region, the p-type second well region, and the n-type first region form an NPN bipolar transistor.

20. The semiconductor device of claim 16, wherein the p-type second well region and the n-type first region form a PN diode, and the p-type fourth region, the n-type first well region, the p-type second well region, and the n-type first region form a silicon controlled rectifier (SCR).

21. The semiconductor device of claim 16 wherein the switch device comprises a diode, a first terminal of the diode being coupled to the n-type third region and a second terminal of the diode being coupled to the second potential.

22. The semiconductor device of claim 16, wherein the switch device comprises a MOSFET, a first terminal of the MOSFET being coupled to the n-type third region and a second terminal of the MOSFET being coupled to the first potential.

23. The semiconductor device of claim 22 wherein a gate terminal of the MOSFET is electrically coupled to the p-type fourth region through a capacitor and electrically coupled to a ground potential through a resistor.

* * * * *